United States Patent
Reiter et al.

(10) Patent No.: US 12,316,212 B2
(45) Date of Patent: *May 27, 2025

(54) POWER ELECTRONICS SYSTEM HAVING A DIFFERENTIAL HALL SENSOR, METHOD OF FABRICATING THE POWER ELECTRONICS SYSTEM, AND METHOD OF OPERATING A POWER SEMICONDUCTOR MODULE OF THE POWER ELECTRONICS SYSTEM

(71) Applicant: Infineon Technologies AG, Neubiberg (DE)

(72) Inventors: Tomas Reiter, Ottobrunn (DE); Dietmar Spitzer, Völkermarkt (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,956

(22) Filed: Apr. 11, 2024

(65) Prior Publication Data
US 2024/0275268 A1    Aug. 15, 2024

Related U.S. Application Data

(63) Continuation of application No. 18/090,096, filed on Dec. 28, 2022, now Pat. No. 12,218,578.

(30) Foreign Application Priority Data

Jan. 3, 2022 (DE) .......................... 102022100034.6

(51) Int. Cl.
*H02M 1/32* (2007.01)
*H02M 7/00* (2006.01)
*H02M 7/5387* (2007.01)

(52) U.S. Cl.
CPC ............. *H02M 1/32* (2013.01); *H02M 7/003* (2013.01); *H02M 7/5387* (2013.01)

(58) Field of Classification Search
CPC ....... H02M 1/32; H02M 7/003; H02M 7/5387
See application file for complete search history.

(56) References Cited

U.S. PATENT DOCUMENTS

| 2019/0229640 A1 | 7/2019 | Aichriedler et al. |
| 2019/0310325 A1 | 10/2019 | Leisenheimer |

(Continued)

FOREIGN PATENT DOCUMENTS

| CN | 110071645 A | 7/2019 |
| CN | 111886802 A | 11/2020 |
| DE | 102019103030 A1 | 10/2019 |

*Primary Examiner* — Rafael O De Leon Domenech
(74) *Attorney, Agent, or Firm* — Murphy, Bilak & Homiller, PLLC (57) ABSTRACT

A power electronics system includes: a power semiconductor module with opposite first and second sides and lateral sides connecting the first and second sides. The power semiconductor module includes: at least one power semiconductor die forming at least one part of a half bridge circuit, an encapsulation encapsulating the power semiconductor die, and an external contact configured as a current contact of the half bridge circuit and exposed from the encapsulation at a lateral side of the power semiconductor module. A driver module arranged over the first side of the power semiconductor module is configured to control the half bridge circuit. A differential Hall sensor arranged over the external contact is configured to detect a current in the external contact. The driver module is configured to modify a control pattern of the half bridge circuit based on a current value detected by the differential Hall sensor.

17 Claims, 4 Drawing Sheets

(56) References Cited

U.S. PATENT DOCUMENTS

2021/0006240 A1   1/2021   Schläfli et al.
2022/0146603 A1   5/2022   Leisenheimer
2023/0412066 A1* 12/2023  Reiter ..................... H01L 23/62

* cited by examiner

Power Electronics System Having A Differential Hall Sensor, Method Of Fabricating The Power Electronics System, And Method Of Operating A Power Semiconductor Module Of The Power Electronics System

TECHNICAL FIELD

This disclosure relates in general to a power electronics system, to a method for fabricating a power electronics system and to a method of protecting a half bridge circuit from an overload or overcurrent.

BACKGROUND

A power electronics system may comprise a power semiconductor module and a driver module configured to control a power circuit of the power semiconductor module, e.g. a half bridge circuit. An electrical failure like an overload, an overcurrent or a short in the power circuit may cause damage to the power semiconductor module and/or to an appliance (e.g. an automotive battery) coupled to the power semiconductor module. Such an electrical failure may for example occur when the driver module transmits incorrect control signals to the power semiconductor module. In order to e.g. prevent permanent damage or to prevent an automotive battery from catching fire, it may be desirable to shut off the power circuit as fast as possible (before the overload or overcurrent becomes too high). In particular power semiconductor modules which comprise SiC power semiconductor dies may be required to be shut off faster than power semiconductor modules which comprise IGBTs in order to avoid damage, a fire, etc. Improved power electronics systems, improved methods for fabricating a power electronics system and improved methods of protecting a half bridge circuit from an overload or overcurrent may help to solve these and other problems.

The problem on which the invention is based is solved by the features of the independent claims. Further advantageous examples are described in the dependent claims.

SUMMARY

Various aspects pertain to a power electronics system, comprising: a power semiconductor module with a first side, an opposite second side and lateral sides connecting the first and second sides, the power semiconductor module comprising: at least one power semiconductor die forming at least one part of a half bridge circuit, a first encapsulation encapsulating the at least one power semiconductor die, and at least one external contact configured as a direct current contact of the half bridge circuit, wherein the external contact is exposed from the first encapsulation at a lateral side of the power semiconductor module; a driver module arranged over the first side of the power semiconductor module and being configured to control the half bridge circuit; and a differential Hall sensor arranged over the external contact and being configured to detect a direct current flowing through the external contact, wherein the driver module is configured to modify a control pattern of the half bridge circuit based on a direct current value detected by the differential Hall sensor.

Various aspects pertain to a method of fabricating a power electronics system, the method comprising: providing a power semiconductor module with a first side, an opposite second side and lateral sides connecting the first and second sides, the power semiconductor module comprising: at least one power semiconductor die forming at least one part of a half bridge circuit, a first encapsulation encapsulating the at least one power semiconductor die, and at least one external contact configured as a direct current contact of the half bridge circuit, wherein the external contact is exposed from the first encapsulation at a lateral side of the power semiconductor module; arranging a driver module over the first side of the power semiconductor module, the driver module being configured to control the half bridge circuit; and arranging a differential Hall sensor over the external contact, the differential Hall sensor being configured to detect a direct current flowing through the external contact, wherein the driver module is configured to modify a control pattern of the half bridge circuit based on a direct current value detected by the differential Hall sensor.

Various aspects pertain to a method of protecting a half bridge circuit from an overload or an overcurrent, the method comprising: providing a power semiconductor module comprising at least one power semiconductor die, the at least one power semiconductor die forming at least one part of a half bridge circuit, detecting a direct current in an external contact of the power semiconductor module using a differential Hall sensor, and based on a detected direct current value, shutting down the half bridge circuit.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numbers designate corresponding similar parts.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only. It is to be understood that other examples may be utilized and structural or logical changes may be made.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The semiconductor die(s) described in the following can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor die(s) may have contact pads (or electrodes) which allow electrical contact to be made with the integrated circuits included in the semiconductor die(s). The electrodes may be arranged all at only one main face(s) of the semiconductor die(s) or at both main faces of the semiconductor die(s).

An efficient power electronics system, method for fabricating a power electronics system or method of protecting a half bridge circuit from an overload or overcurrent may for example reduce material consumption, ohmic losses, chemical waste, etc. and thus enable energy and/or resource savings. Improved power electronics systems, improved methods for fabricating a power electronics system and improved methods of protecting a half bridge circuit from an overload or overcurrent, as specified in this description, may thus at least indirectly contribute to green technology solutions, i.e. climate-friendly solutions providing a mitigation of energy and/or resource use.

Figure 1:
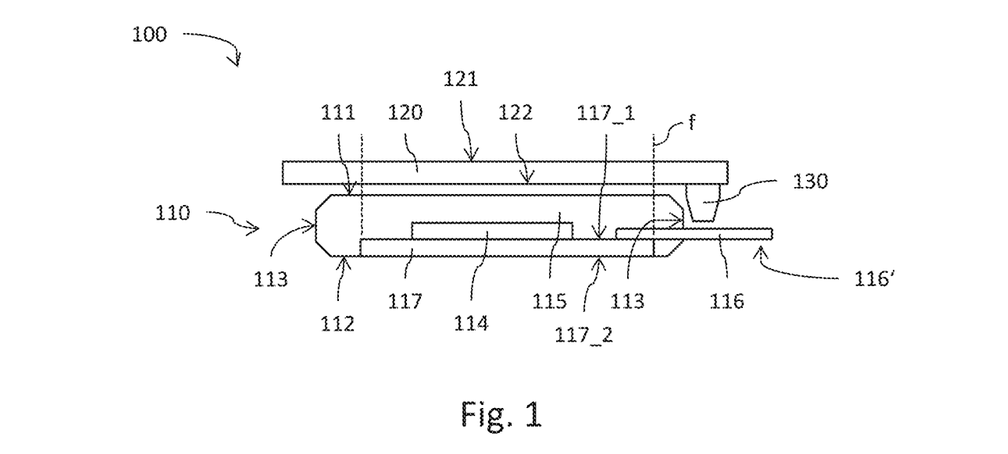
FIG. 1 shows a side view of an exemplary power electronics system comprising a power semiconductor module, a driver module configured to control the power semiconductor module and a differential Hall sensor arranged over an external contact of the power semiconductor module.

FIG. 1 shows a power electronics system 100 comprising a power semiconductor module 110, a driver module 120 and a differential Hall sensor 130.

The power semiconductor module 110 comprises a first side 111, an opposite second side 112 and lateral sides 113 connecting the first and second sides 111, 112. The power semiconductor module 110 further comprises at least one power semiconductor die 114, a first encapsulation 115 and at least one external contact 116.

The at least one power semiconductor die 114 forms at least one part of a half bridge circuit. The at least one power semiconductor die 114 may be configured to operate with a high electrical current and/or a high voltage. According to an example, the power semiconductor module 110 comprises one or more further power semiconductor dies which may form the remaining part of the half bridge circuit and/or which may form (alone or together with the power semiconductor die 114) one or more further electrical circuits, e.g. half bridge circuit(s), full bridge circuit(s), inverter circuit(s), converter circuit(s), etc.

The first encapsulation 115 encapsulates the at least one power semiconductor die 114. The first encapsulation 115 may be configured to protect the at least one power semiconductor die 114 from environmental impacts. In the case that the power semiconductor module 110 comprises further power semiconductor die(s), the further power semiconductor die(s) may also be encapsulated by the first encapsulation 115. The first encapsulation 115 may for example comprise a plastic frame and/or a molded body. The first, second and lateral sides 111, 112, 113 of the power semiconductor module 110 may be sides of the first encapsulation 115.

The at least one external contact 116 is configured as a direct current contact of the half bridge circuit. Furthermore, the external contact 116 may be exposed from the first encapsulation 115 at a lateral side 113 of the power semiconductor module 110. The at least one external contact 116 may comprise or consist of any suitable metal, for example Al, Cu or Fe, or any suitable metal alloy. According to an example, the external contact 116 comprises or consists of a leadframe part. The external contact 116 may for example comprise or consist of a busbar.

A distal end 116' of the external contact 116 may be configured to be coupled to an external appliance, e.g. a voltage source. The distal end 116' of the external contact 116 may for example be coupled to the external appliance using a solder joint.

The power semiconductor module 110 may comprise one or more further external contacts which may be similar or identical to the external contact 116. The power semiconductor module 110 may for example comprise further external contact(s) which are configured as alternating current contact(s) or as direct current contact(s) of the half bridge circuit and/or of one or more further electrical circuits comprised in the power semiconductor module 110. The one or more further external contacts may be arranged at the same lateral side 113 of the power semiconductor module 110 as the external contact 116. Additionally or alternatively, one or more further external contacts may be arranged on one or more further laterals sides 113, e.g. on the lateral side 113 opposite to the lateral side 113 with the external contact 116.

According to an example, all external contacts of the power semiconductor module 110 are arranged in the same plane. According to another example, one or more eternal contacts are arranged in a different plane, e.g. a plane parallel to the plane of the external contact 116 but above or below this plane.

According to an example, the power semiconductor module 110 comprises a carrier 117, wherein the at least one power semiconductor die 114 is arranged on the carrier 117. The at least one power semiconductor die 114 may also be electrically coupled to the carrier 117, e.g. via a solder joint. The carrier 117 may for example be a power substrate of the type direct copper bond (DCB), direct aluminum bond (DAB), active metal brazing (AMB), etc. The external contact 116 may also be arranged on and electrically coupled to the carrier 117, e.g. via a solder joint. The external contact 116 may e.g. be electrically coupled to the power semiconductor die 114 via the carrier 117.

According to an example, the power semiconductor die 114 and the external contact 116 may be arranged on the same side of the carrier, e.g. on a first side 117_1 of the carrier 117 (wherein the first side 117_1 faces the driver module 120). According to an example, a second side 117_2 of the carrier 117, wherein the second side 117_2 is opposite the first side 117_1, may be exposed from the encapsulation 115 on the second side 112 of the power semiconductor module. The second side 117_2 of the carrier 117 may e.g. be configured to be coupled to a baseplate or to a heatsink. In particular, the power semiconductor module 110 may be configured for direct liquid cooling or for indirect liquid cooling.

The driver module 120 is arranged over the first side 111 of the power semiconductor module 110. The driver module 120 may e.g. be arranged directly above the first side 111. The driver module 120 may e.g. comprise a printed circuit board (PCB) and driver circuitry arranged on the PCB. The driver module 120 is configured to control the half bridge circuit of the power semiconductor module 110.

According to an example, the driver module 120 is electrically coupled to the power semiconductor module 110 via press fit pins (not shown) extending from the first side 111 of the power semiconductor module 110. Additionally or alternatively, other connecting means, e.g. solder joints, may be used.

The differential Hall sensor 130 is arranged over the external contact 116. The differential Hall sensor 130 may in particular be arranged directly above the external contact 116. The differential Hall sensor 130 may be arranged outside a footprint f of the carrier 117. The differential Hall sensor 130 may also be arranged outside a footprint of the first encapsulation 115 or partially arranged outside a footprint of the first encapsulation 115.

The driver module 120, in particular a PCB of the driver module 120, may have a first side 121 and an opposite second side 122, wherein the second side 122 faces the power semiconductor module 110. The differential Hall sensor 130 may for example be arranged at the second side 122. One or more logic semiconductor dies of the driver module 120 may for example be arranged at the first side 121. The differential Hall sensor 130 may for example be glued, soldered or plugged onto the driver module 120.

The differential Hall sensor 130 is configured to detect a direct current flowing through the external contact 116. Compared to single Hall sensors (or single Hall effect sensors), differential Hall sensors (or differential Hall effect sensors) may offer superior accuracy and/or reliability, for example with regard to problems like stray fields, fabrication tolerances and air gap changes.

The differential Hall sensor 130 may be electrically coupled to the driver module 120 and may be configured to provide the driver module 120 with a detected direct current value. The electrical connection between the differential Hall sensor 130 and the driver module 120 may for example comprise pins, e.g. press fit pins, bond wires and/or solder joints.

According to an example, the differential Hall sensor 130 comprises a sensor module, wherein a differential Hall sensor element is encapsulated by a second encapsulation, different from the first encapsulation 115 of the power semiconductor module 110. The second encapsulation may for example comprise a plastic frame and/or a molded body. The sensor module may further comprise electrical contacts configured to couple the sensor module to the driver module 120.

The driver module 120 is configured to modify a control pattern of the half bridge circuit of the power semiconductor module 110 based on a direct current value detected by the differential Hall sensor 130. For example, the differential Hall sensor 130 may detect a comparatively high direct current value indicative of an overload, an overcurrent or a short and based on the detected direct current value, the driver module 120 may modify a control pattern of the half bridge circuit, for example by stopping a pulse pattern transmitted to the half bridge circuit or by shutting down the half bridge circuit. In this way, damage to the power semiconductor module 110 and/or to an external appliance coupled to the power semiconductor module 110 may be prevented.

Figure 2A:
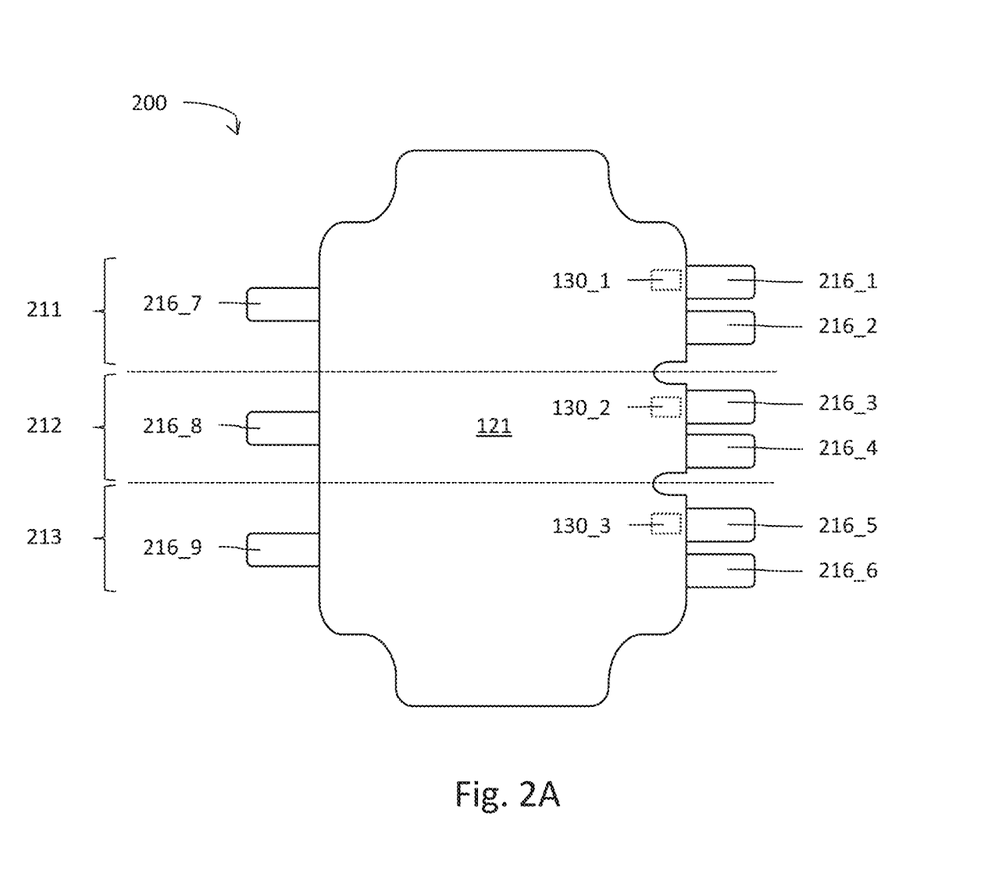
FIGS. 2A and 2B show a top view (FIG. 2A) and a side view (FIG. 2B) of a further exemplary power electronics system.
Figure 2B:
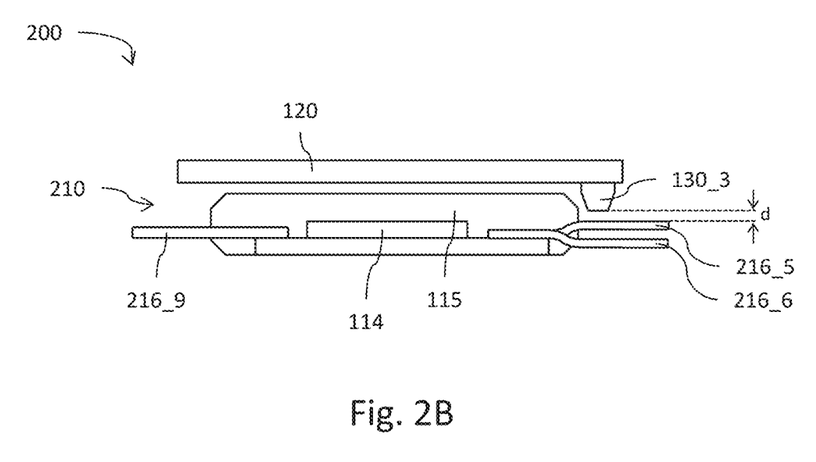

FIGS. 2A and 2B show a further power electronics system 200 which may be similar or identical to the power electronics system 100, except for the differences described in the following. FIG. 2A shows a top view onto the first side 121 of the driver module 120 and FIG. 2B shows a side view similar to FIG. 1.

In particular, the power electronics system 200 comprises a power semiconductor module 210 which may be similar or identical to the power semiconductor module 110. The power electronics system 200 also comprises the driver module 120 and the differential Hall sensor 130. However, the power semiconductor module 210 comprises first to sixth external contacts 216_1 to 216_6 which are configured as direct current contacts. The power semiconductor module 210 additionally comprises a seventh, eighth and ninth external contact 216_7, 216_8, 216_9 which may be configured as phase current contacts.

The power semiconductor module 210 may for example be configured to provide three-phase electric power, e.g. for an electric motor. The power semiconductor module 210 may for example be a so called "six pack module" comprising six power semiconductor dies 114. The power semiconductor module 210 may comprise a first part 211, a second part 212 and a third part 213. Each of the parts 211, 212 and 213 may comprise a half bridge, wherein the half bridges may be coupled together to form e.g. an inverter circuit. The first and second external contacts 216_1 and 216_2 may be direct power contacts and the seventh external contact 216_7 may be a phase current contact of the first half bridge. The third and fourth external contacts 216_3 and 216_4 may be direct power contacts and the eighth external contact 216_8 may be a phase current contact of the second half bridge. The fifth and sixth external contacts 216_5 and 216_6 may be direct power contacts and the ninth external contact 216_9 may be a phase current contact of the third half bridge.

As shown in FIG. 2A, the power electronics system 200 may for example comprise three differential Hall sensors 130_1, 130_2 and 130_3. Each half bridge of the power semiconductor module 210 may be assigned one of the differential Hall sensors 130_1, 130_2 and 130_3. In other words, each of the parts 211, 212 and 213 may comprise an external contact 216 that is configured as a direct current external contact, wherein no differential Hall sensor 130 is arranged at this external contact 216. This may be done because it may not be necessary to monitor both a positive direct current and the corresponding negative direct current in order to detect an overload, overcurrent or short. However, it is also possible that a differential Hall sensor 130 is arranged at both external contacts 216 configured as direct current external contacts of a part 211, 212 or 213 (the second differential Hall sensor may be used as a redundant sensor).

As shown in FIG. 2B, the driver module 120 (in particular, a PCB of the driver module 120) may be arranged in a first plane, the external contact 216_5 may be arranged in a different second plane and the external contact 216_6 may be arranged in a third plane which is different from the first and second planes. According to another example, both direct current contacts 216_5 and 216_6 are arranged in the same plane. The other pairs of direct current contacts 216_1, 216_2 and 216_3, 216_4 may be arranged in a similar manner. Furthermore, the differential Hall sensors 130_1, 130_2 and 130_3 may be arranged over those of the direct current contacts 216_1 to 216_6 that are closer to the driver module 120 (for example because a shorter distance between sensor element and current provides a stronger sensor signal). According to another example, the differential Hall sensors 130_1, 130_2 and 130_3 may be arranged over those of the direct current contacts 216_1 to 216_6 that are further away from the driver module 120 (for example because there is not enough space for the differential Hall sensor above the contacts that are closer to the driver module 120).

A distance d between the corresponding one of the external contacts 216_1 to 216_6 and the corresponding one of the differential Hall sensors 130_1, 130_2 and 130_3 may for example be 6 mm or less, or 5 mm or less, or 4 mm or less. Similarly, a distance between the second side 122 of the driver module 120 and the external contacts 216_1 to 216_6 may for example be 8.2 mm or less, or 5.7 mm or less.

According to an example, the power electronics system 200 comprises additional current sensors, e.g. Hall sensors (particularly differential Hall sensors), arranged at the phase current contacts 216_7, 216_8 and 216_9, wherein these additional current sensors are configured to measure an alternating current in the external contacts 216_7, 216_8 and 216_9.

Figure 3:
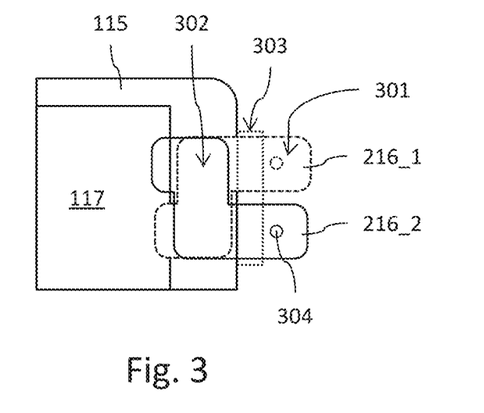
FIG. 3 shows a detail view of exemplary external contacts of a power semiconductor module.

FIG. 3 shows a detail view of the first and second external contacts 216_1 and 216_2 and part of the power semiconductor module 210 of FIG. 2A (the external contact 216_1 is shown with dashed lines in order for it to be more easily distinguishable from external contact 216_2). The driver module 120 and the differential Hall sensor 130 are omitted in FIG. 3 to show the external contacts 216_1 and 216_2 in greater detail.

According to the example shown in FIG. 3, the external contacts 216_1 and 216_2 may overlap in an overlapping region 302. Such an overlapping region 302 may for example help with reducing stray inductance in the power semiconductor module 210. However, this also means that the overlapping region 302 may not be suited for placing the differential Hall sensor 130 due to the lack of a sufficient signal. Furthermore, the distal end regions 301 of the external contacts 216_1 and 216_2 are not suited for placing the differential Hall sensor 130 because the distal end regions 301 are configured to be coupled to an external appliance.

For these reasons, it may only be possible to place the differential Hall sensor 130 within the footprint of the sensor placing region 303 indicated in FIG. 3. The sensor placing region 303 may be a comparatively thin strip between the distal end regions 301 and the overlapping region 302. It may not be desirable to increase the length of the external contacts 216 to increase the size of the sensor placing region 303 because this in turn would increase the inductance of the power semiconductor module 210.

The sensor placing region 303 may for example be arranged completely outside a footprint of the first encapsulation 115, completely inside a footprint of the first encapsulation 115 or partially inside and partially outside a footprint of the first encapsulation 115. In the case that the sensor placing region 303 is arranged at least partially within the footprint of the first encapsulation 115, the first encapsulation 115 may comprise a recess configured to receive the differential Hall sensor 130. According to an example, the distal end regions 301 may comprise holes 304 configured for coupling the distal end regions 301 to an external appliance, e.g. a capacitor. In this case, the sensor placing region 303 may be arranged between the overlapping region 302 and the holes 304. According to another example, the distal end regions 301 do not comprise holes.

Figure 4:
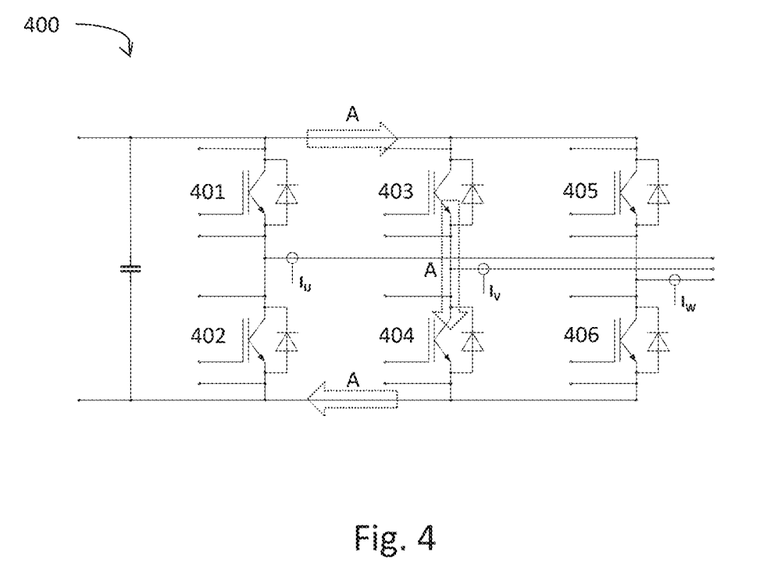
FIG. 4 shows an exemplary electrical circuit which may be realized in a power semiconductor module of a power electronics system.

FIG. 4 shows an electrical circuit 400 which may be realized in the power semiconductor modules 110 and 210. The electrical circuit 400 may e.g. comprise first to sixth switches 401 to 406 which may e.g. be realized in one or more power semiconductor dies 114. The electrical circuit 400 provides three-phase electrical power $I_U$, $I_V$ and $I_W$. The currents $I_U$, $I_V$ and $I_W$ may be provided at the external contacts 216_7, 216_8 and 216_9.

The arrows A in FIG. 4 indicate an exemplary overload, overcurrent or short which involves the third and fourth switches 403 and 404 but none of the phase current contacts (e.g. the external contacts 216_7, 216_8 and 216_9, compare FIG. 2A). A current sensor arranged at anyone of the phase current contacts therefore would not be able to detect the electrical failure shown in FIG. 4. However, by detecting the direct current flowing into or out of the third and/or fourth switch 403, 404 the overload, overcurrent or short can be detected and the electrical circuit 400 can be modified, e.g. by stopping a pulse pattern (a driver signal) or by shutting down the electrical circuit 400.

This shutdown can potentially be performed within a very short time span, e.g. 1.8 µs or less, or even 1.5 µs or less, after a differential Hall sensor 130 has detected the overload, overcurrent or short. In particular in the case that the switches 401 to 406 are realized in one or more SiC dies, it may be advantageous to detect the occurrence of an electrical failure within as short a time span as possible. Detecting the overload, overcurrent or short with the differential Hall sensor 130 above a direct current contact as shown here may be faster than using a DESAT detection circuit.

The measurement via the differential Hall sensors 130_1, 130_2 and 130_3 of the direct currents flowing through the external contacts 216_1, 216_3 and 216_5 (compare FIG. 2A) may also be used as redundancy for a phase current measurement of the phase currents $I_U$, $I_V$ and $I_W$ (compare FIG. 4). In the case that one or more phase current sensors configured to measure the phase currents $I_U$, $I_V$ and $I_W$ is defective, the phase current may be derived from the direct current measurement of the corresponding differential Hall sensor 130_1, 130_2 or 130_3 because the phase current is proportional to the corresponding direct current. Furthermore, the sensor signal of the differential Hall sensors 130_1, 130_2 and 130_3 may e.g. be used for an online diagnosis of the inverter efficiency of the power semiconductor module 110 or 210.

Figure 5:
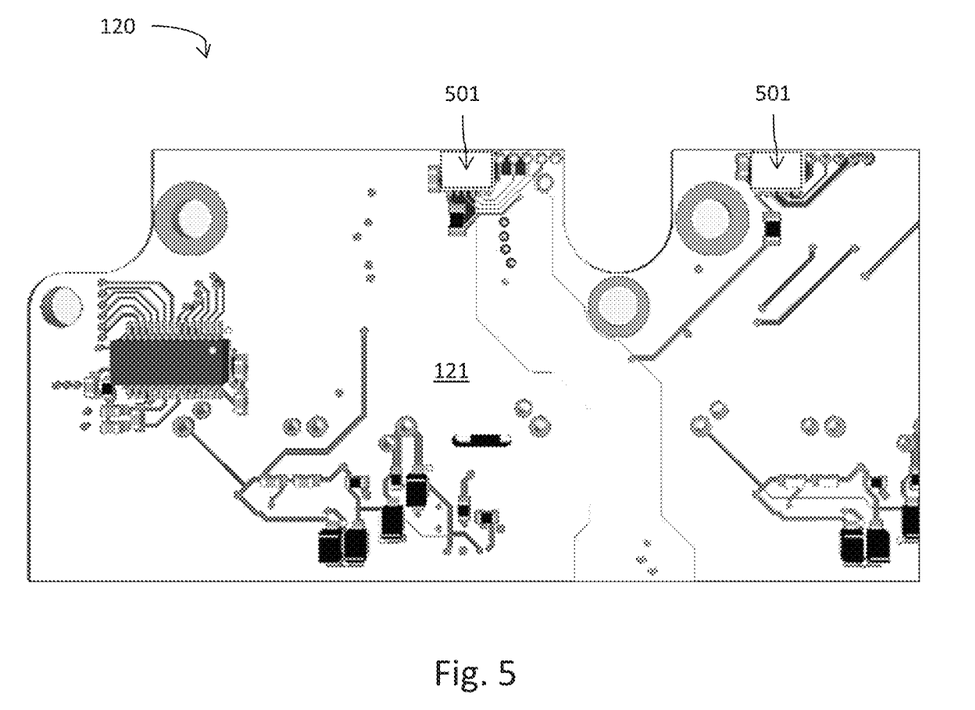
FIG. 5 shows a detail view of an exemplary driver module of a power electronics system.

FIG. 5 shows a detail view of part of the first side 121 of an exemplary driver module 120. The driver module 120 comprises one or more dedicated sensor attaching regions 501, wherein a differential Hall sensor 130 may be attached to the driver module 120 in a sensor attaching region 501. A differential Hall sensor 130 may in particular be attached to the second side 122 of the driver module (compare FIG. 1) in a sensor attaching region 501.

According to an example, the driver module 120 (in particular, a PCB of the driver module 120) is free of any conductive layers in the sensor attaching region(s) 501 (i.e. in an area directly above the differential Hall sensor 130). In this context, "free of any conductive layers" may mean that indeed no conductive material is arranged in a sensor attaching region 501 or that only one or more conductive tracks configured for coupling the differential Hall sensor 130 to the driver module 120 but no other conductive material is arranged in the sensor attaching region 501. Keeping the sensor attaching regions 501 free of any conductive layers may reduce stray fields that could negatively affect sensor accuracy.

Figure 6:
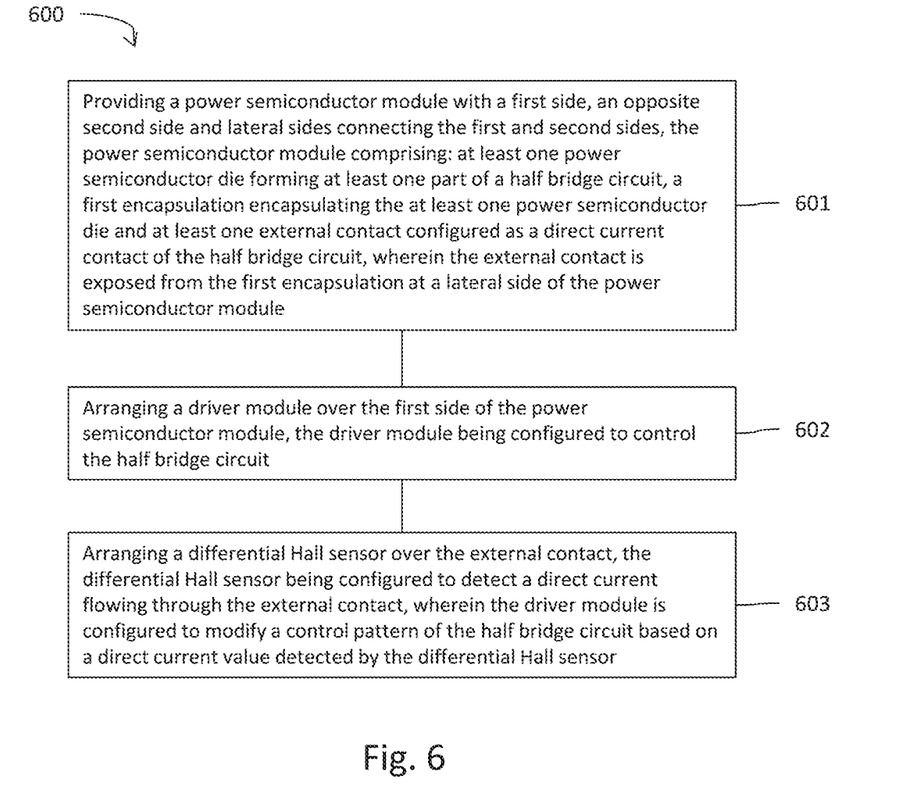
FIG. 6 is a flow chart of an exemplary method for fabricating a power electronics system.

FIG. 6 is a flow chart of a method 600 of fabricating a power electronics system. The method 600 may for example be used to fabricate the power electronics system 100 or 200.

The method 600 comprises at 601 a process of providing a power semiconductor module with a first side, an opposite second side and lateral sides connecting the first and second sides, the power semiconductor module comprising: at least one power semiconductor die forming at least one part of a half bridge circuit, a first encapsulation encapsulating the at least one power semiconductor die and at least one external contact configured as a direct current contact of the half bridge circuit, wherein the external contact is exposed from the first encapsulation at a lateral side of the power semiconductor module; method 600 comprises at 602 a process of arranging a driver module over the first side of the power semiconductor module, the driver module being configured to control the half bridge circuit and at 603 a process of arranging a differential Hall sensor over the external contact, the differential Hall sensor being configured to detect a direct current flowing through the external contact, wherein the driver module is configured to modify a control pattern of the half bridge circuit based on a direct current value detected by the differential Hall sensor.

According to an example of method 600, the differential Hall sensor is attached to a printed circuit board of the driver module over the external contact. This may for example be done prior to arranging the driver module over the power semiconductor module. According to an example, the differential Hall sensor is arranged over the external contact after the power semiconductor die has been encapsulated with the first encapsulation. The differential Hall sensor may comprise a sensor module with a second encapsulation encapsulating a differential Hall sensor element. The differential Hall sensor element may for example be encapsulated with the second encapsulation prior to attaching the differential Hall sensor to the driver module.

Figure 7:
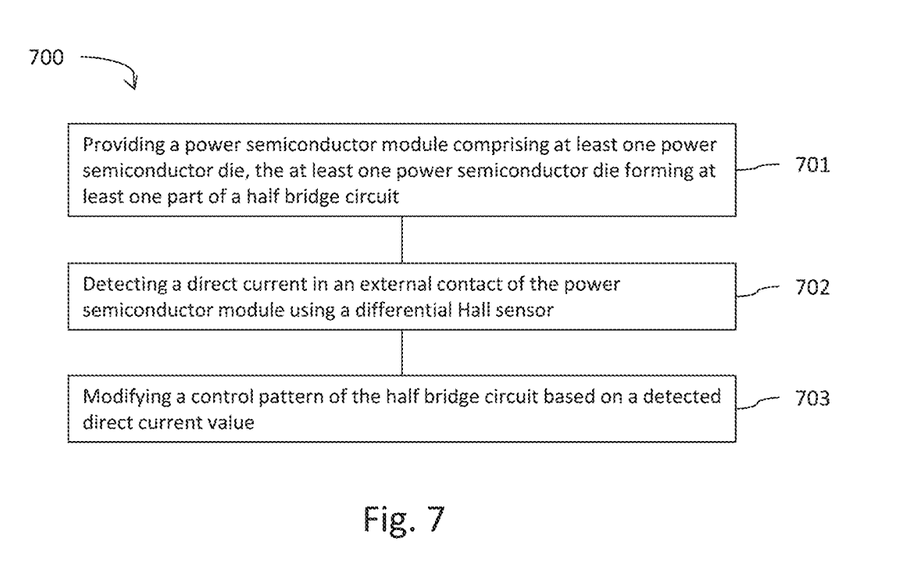
FIG. 7 is a flow chart of an exemplary method for protecting a half bridge circuit from an overload or overcurrent.

FIG. 7 is a flow chart of a method 700 of protecting a half bridge circuit from an overload or an overcurrent or a short. The method 700 may for example be used to protect a circuit comprised in the power semiconductor module 110 or 210.

The method 700 comprises at 701 a process of providing a power semiconductor module comprising at least one power semiconductor die, the at least one power semiconductor die forming at least one part of a half bridge circuit, at 702 a process of detecting a direct current in an external contact of the power semiconductor module using a differential Hall sensor and at 703 a process of shutting down the half bridge circuit based on a detected direct current value.

In the following, the power electronics system, the method for fabricating a power electronics system and the method for protecting a half bridge circuit are further explained using specific examples.

Example 1 is a power electronics system, comprising: a power semiconductor module with a first side, an opposite second side and lateral sides connecting the first and second sides, the power semiconductor module comprising: at least one power semiconductor die forming at least one part of a half bridge circuit, a first encapsulation encapsulating the at least one power semiconductor die, and at least one external contact configured as a direct current contact of the half bridge circuit, wherein the external contact is exposed from the first encapsulation at a lateral side of the power semiconductor module; a driver module arranged over the first side of the power semiconductor module and being configured to control the half bridge circuit; and a differential Hall sensor arranged over the external contact and being configured to detect a direct current flowing through the external contact, wherein the driver module is configured to modify a control pattern of the half bridge circuit based on a direct current value detected by the differential Hall sensor.

Example 2 is the power electronics system of example 1, wherein modifying the control pattern comprises stopping a pulse pattern or shutting down the half bridge circuit.

Example 3 is the power electronics system of example 1 or 2, wherein the driver module comprises a printed circuit board, wherein the differential Hall sensor is attached to a second side of the printed circuit board facing the first side of the power semiconductor module.

Example 4 is the power electronics system of example 3, wherein the printed circuit board is free of any conductive layers in an area directly above the differential Hall sensor.

Example 5 is the power electronics system of example 3 or 4, wherein the power semiconductor module comprises a further external contact configured as a further direct current contact of the half bridge circuit, wherein the printed circuit board is arranged in a first plane, the external contact is arranged in a different second plane and the further external contact is arranged in a third plane, different from the first and second planes, and wherein a distance between the first and second planes is smaller than a distance between the first and third planes.

Example 6 is the power electronics system of one of the preceding examples, wherein the differential Hall sensor is arranged outside of the first encapsulation.

Example 7 is the power electronics system of one of the preceding examples, wherein the at least one power semiconductor die is arranged on a first side of a carrier, and wherein the differential Hall sensor is arranged outside of a circumference of the first side of the carrier.

Example 8 is the power electronics system of one of the preceding examples, wherein the power semiconductor module comprises first and second external contacts comprising an overlapping region and distal end regions, wherein the first and second external contacts overlap in an overlapping region and wherein the distal end regions are configured to be coupled to an external appliance, and wherein the differential Hall sensor is arranged between the overlapping region and the distal end regions.

Example 9 is the power electronics system of one of the preceding examples, wherein the differential Hall sensor is comprised in a sensor module, the sensor module comprising electrical contacts coupled to the driver module and a second encapsulation encapsulating the differential Hall sensor.

Example 10 is the power electronics system of one of the preceding examples, wherein the differential Hall sensor has a fast digital overcurrent output and an analog output for the direct current value, wherein the driver module is configured to use an analog output value of the analog output to perform online efficiency calculation and/or state of health analysis of the power semiconductor module, or wherein the driver module is configured to use the analog output value as redundancy for sensor signals of phase current sensors of the power electronics system.

Example 11 is the power electronics system of one of the preceding examples, wherein a distance between the external contact and the differential Hall sensor is 6 mm or less.

Example 12 is a method of fabricating a power electronics system, the method comprising: providing a power semiconductor module with a first side, an opposite second side and lateral sides connecting the first and second sides, the power semiconductor module comprising: at least one power semiconductor die forming at least one part of a half bridge circuit, a first encapsulation encapsulating the at least one power semiconductor die, and at least one external contact configured as a direct current contact of the half bridge circuit, wherein the external contact is exposed from the first encapsulation at a lateral side of the power semiconductor module; arranging a driver module over the first side of the power semiconductor module, the driver module being configured to control the half bridge circuit; and arranging a differential Hall sensor over the external contact, the differential Hall sensor being configured to detect a direct current flowing through the external contact, wherein the driver module is configured to modify a control pattern of the half bridge circuit based on a direct current value detected by the differential Hall sensor.

Example 13 is the method of example 12, wherein arranging the differential Hall sensor over the external contact comprises attaching the differential Hall sensor to a printed circuit board of the driver module.

Example 14 is the method of example 13, wherein the printed circuit board is free of any conductive layers in an area directly above the differential Hall sensor.

Example 15 is the method of one of examples 12 to 14, wherein providing the power semiconductor module comprises encapsulating the power semiconductor die with the encapsulation, and wherein the differential Hall sensor is arranged over the external contact after the power semiconductor die has been encapsulated.

Example 16 is a method of protecting a half bridge circuit from an overload or an overcurrent, the method comprising: providing a power semiconductor module comprising at least one power semiconductor die, the at least one power semiconductor die forming at least one part of a half bridge circuit, detecting a direct current in an external contact of the power semiconductor module using a differential Hall sensor, and based on a detected direct current value, shutting down the half bridge circuit.

Example 17 is the method of example 16, wherein the control pattern of the half bridge circuit is modified 1.8 μs or less after an overload or an overcurrent has been detected by the differential Hall sensor.

Example 18 is an apparatus comprising means for performing the method according to anyone of examples 12 to 17.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power electronics system, comprising:
    a power semiconductor module with a first side, an opposite second side, and lateral sides connecting the first and second sides, the power semiconductor module comprising:
        at least one power semiconductor die forming at least one part of a half bridge circuit;
        a first encapsulation encapsulating the at least one power semiconductor die; and
        at least one external contact configured as a current contact of the half bridge circuit, wherein the external contact is exposed from the first encapsulation at a lateral side of the power semiconductor module;
    a driver module arranged over the first side of the power semiconductor module and being configured to control the half bridge circuit; and
    a differential Hall sensor arranged over the external contact and being configured to detect a current in the external contact,
    wherein the driver module is configured to modify a control pattern of the half bridge circuit based on a current value detected by the differential Hall sensor.

2. The power electronics system of claim 1, wherein the driver module is configured to modify the control pattern by stopping a pulse pattern or shutting down the half bridge circuit.

3. The power electronics system of claim 1, wherein the driver module comprises a printed circuit board, and wherein the differential Hall sensor is attached to a second side of the printed circuit board facing the first side of the power semiconductor module.

4. The power electronics system of claim 3, wherein the printed circuit board is free of any conductive layers in an area directly above the differential Hall sensor.

5. The power electronics system of claim 3, wherein the power semiconductor module comprises a further external contact configured as a further current contact of the half bridge circuit, wherein the printed circuit board is arranged in a first plane, wherein the external contact is arranged in a different second plane, and wherein the further external contact is arranged in a third plane different from the first and second planes, and wherein a distance between the first and second planes is smaller than a distance between the first and third planes.

6. The power electronics system of claim 1, wherein the differential Hall sensor is arranged outside of the first encapsulation.

7. The power electronics system of claim 1, wherein the at least one power semiconductor die is arranged on a first side of a carrier, and wherein the differential Hall sensor is arranged outside of a footprint of the first side of the carrier.

8. The power electronics system of claim 1, wherein the power semiconductor module comprises first and second external contacts comprising an overlapping region and distal end regions, wherein the first and second external contacts overlap in an overlapping region, wherein the distal end regions are configured to be coupled to an external appliance, and wherein the differential Hall sensor is arranged between the overlapping region and the distal end regions.

9. The power electronics system of claim 1, wherein the differential Hall sensor is comprised in a sensor module, the sensor module comprising electrical contacts coupled to the driver module and a second encapsulation encapsulating the differential Hall sensor.

10. The power electronics system of claim 1, wherein the differential Hall sensor has a fast digital overcurrent output and an analog output for the current value detected by the differential Hall sensor, wherein the driver module is configured to use an analog output value of the analog output to perform online efficiency calculation and/or state of health analysis of the power semiconductor module, or wherein the driver module is configured to use the analog output value as redundancy for sensor signals of phase current sensors of the power electronics system.

11. The power electronics system of claim 1, wherein a distance between the external contact and the differential Hall sensor is 6 mm or less.

12. A method of fabricating a power electronics system, the method comprising:
providing a power semiconductor module with a first side, an opposite second side, and lateral sides connecting the first and second sides, the power semiconductor module comprising at least one power semiconductor die forming at least one part of a half bridge circuit, a first encapsulation encapsulating the at least one power semiconductor die, and at least one external contact configured as a current contact of the half bridge circuit, wherein the external contact is exposed from the first encapsulation at a lateral side of the power semiconductor module;
arranging a driver module over the first side of the power semiconductor module, the driver module being configured to control the half bridge circuit; and
arranging a differential Hall sensor over the external contact, the differential Hall sensor being configured to detect a current in the external contact,
wherein the driver module is configured to modify a control pattern of the half bridge circuit based on a current value detected by the differential Hall sensor.

13. The method of claim 12, wherein arranging the differential Hall sensor over the external contact comprises attaching the differential Hall sensor to a printed circuit board of the driver module.

14. The method of claim 13, wherein the printed circuit board is free of any conductive layers in an area directly above the differential Hall sensor.

15. The method of claim 12, wherein providing the power semiconductor module comprises encapsulating the power semiconductor die with the encapsulation, and wherein the differential Hall sensor is arranged over the external contact after the power semiconductor die has been encapsulated.

16. A method of operating a power semiconductor module with a first side, an opposite second side, and lateral sides connecting the first and second sides, the power semiconductor module comprising at least one power semiconductor die forming at least one part of a half bridge circuit, a first encapsulation encapsulating the at least one power semiconductor die, and at least one external contact configured as a current contact of the half bridge circuit, wherein the external contact is exposed from the first encapsulation at a lateral side of the power semiconductor module, the method comprising:
detecting a current in the external contact of the power semiconductor module using a differential Hall sensor arranged over the external contact; and
based on a current value detected by the differential Hall sensor, modifying a control pattern of the half bridge circuit via a driver module arranged over the first side of the power semiconductor module.

17. The method of claim 16, wherein the control pattern is modified 1.8us or less after an overload or an overcurrent has been detected by the differential Hall sensor.

* * * * *